(12) United States Patent
Fang et al.

(10) Patent No.: US 9,450,077 B2
(45) Date of Patent: Sep. 20, 2016

(54) METHOD OF MANUFACTURING THIN FILM TRANSISTOR

(71) Applicant: Ye Xin Technology Consulting Co., Ltd., Hsinchu (TW)

(72) Inventors: Kuo-Lung Fang, Hsinchu (TW); Yi-Chun Kao, Hsinchu (TW); Po-Li Shih, Hsinchu (TW); Chih-Lung Lee, Hsinchu (TW); Hsin-Hua Lin, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/586,009

(22) Filed: Dec. 30, 2014

(65) Prior Publication Data
US 2016/0118478 A1    Apr. 28, 2016

(30) Foreign Application Priority Data

Oct. 27, 2014    (TW) .............................. 103136974 A

(51) Int. Cl.
*H01L 29/66*    (2006.01)
(52) U.S. Cl.
CPC .............................. *H01L 29/66742* (2013.01)

(58) Field of Classification Search
CPC .......... H01L 27/1214; H01L 27/1288; H01L 29/4908; H01L 29/66765
See application file for complete search history.

(56) References Cited

U.S. PATENT DOCUMENTS

| 6,338,988 B1* | 1/2002 | Andry ................. H01L 27/1214 257/E21.414 |
| 2003/0025444 A1* | 2/2003 | Seo ................... H01L 29/66757 313/499 |
| 2007/0037070 A1 | 2/2007 | Ohnuma et al. |
| 2008/0003726 A1* | 1/2008 | Park .................... H01L 27/1214 438/149 |
| 2012/0156834 A1* | 6/2012 | Chou ................. H01L 27/1288 438/158 |

FOREIGN PATENT DOCUMENTS

| TW | 200725167 A | 7/2007 |
| TW | 201003844 A | 1/2010 |

* cited by examiner

*Primary Examiner* — Mohammad Islam
*Assistant Examiner* — Christina Sylvia
(74) *Attorney, Agent, or Firm* — Zhigang Ma

(57) ABSTRACT

A method of manufacturing a thin film transistor substrate is provided, including a first photoresist pattern covers a channel during a process of etching a second photoresist pattern and protects the channel. Thus, an etching stop layer is not required.

15 Claims, 14 Drawing Sheets

METHOD OF MANUFACTURING THIN FILM TRANSISTOR

FIELD

The subject matter herein generally relates to a thin film transistor manufacture and method thereof.

BACKGROUND

A thin film transistor usually includes an etching stop layer on a channel for protecting the channel of the thin film transistor. However, the etching stop layer increases the overall thickness and fabricating costs of the thin film transistor. The etching stop layer is problematic.

BRIEF DESCRIPTION OF THE DRAWINGS

Implementations of the present technology will now be described, by way of example only, with reference to the attached figures.

DETAILED DESCRIPTION

Figure 1:
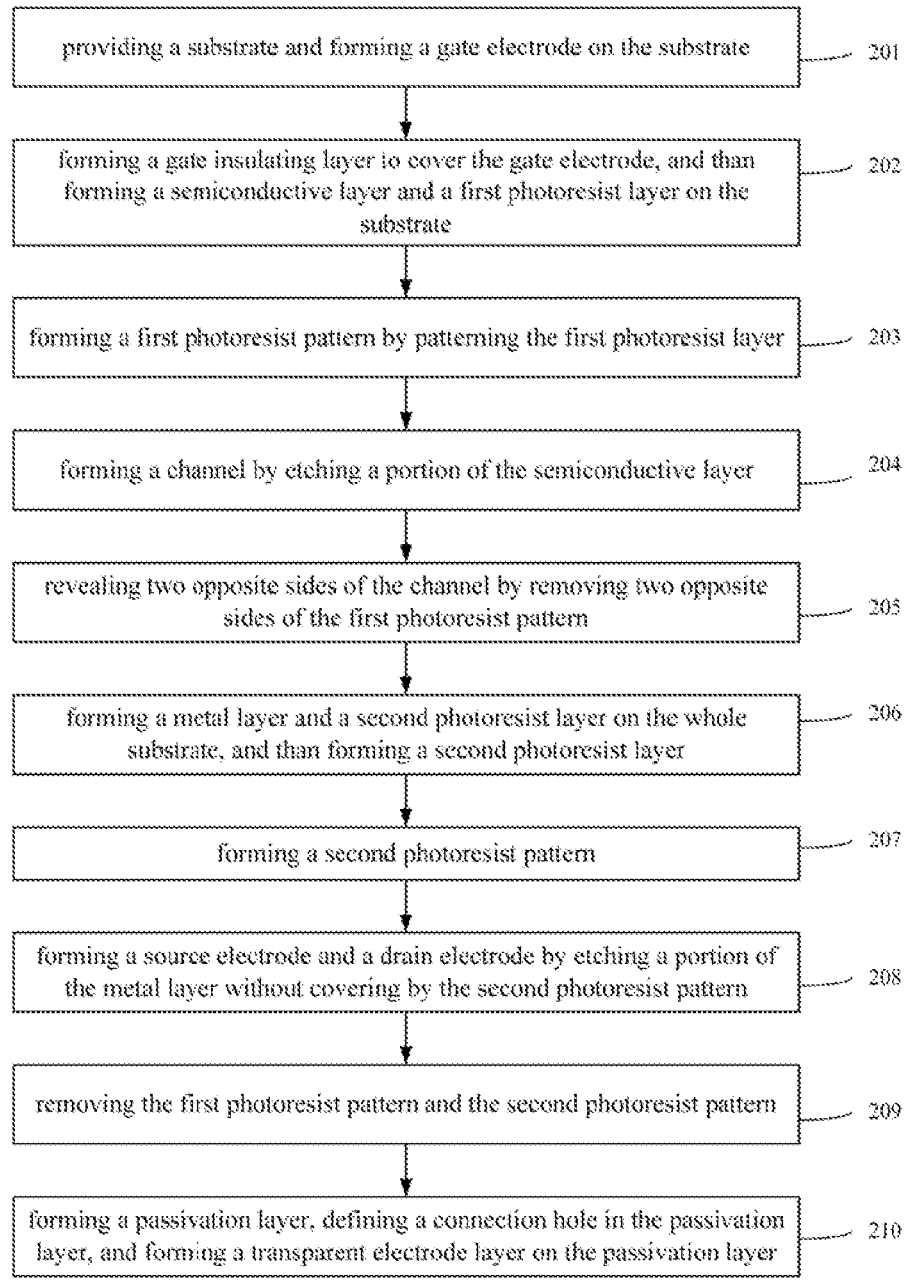
FIG. 1 is a flowchart of an embodiment of a method of manufacturing a thin film transistor substrate.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series and the like.

Referring to FIG. 1, a flowchart is presented in accordance with an example embodiment which is being thus illustrated. The example method is provided by way of example, as there are a variety of ways to carry out the method. The method described below can be carried out using the configurations illustrated in FIGS. 2 to 13, for example, and various elements of these figures are referenced in explaining example method. Each block shown in FIG. 1 represents one or more processes, methods or subroutines, carried out in the exemplary method. Furthermore, the illustrated order of blocks is by example only and the order of the blocks can change according to the present disclosure. Additional blocks may be added or fewer blocks may be utilized, without departing from this disclosure. The exemplary method can begin at block 201.

Figure 2:
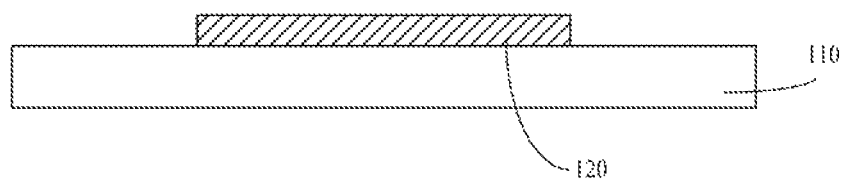
FIG. 2 illustrates that a substrate and a gate electrode are formed.

At block 201, referring to FIG. 2, a substrate 110 is provided, and a gate electrode 120 is formed on the substrate 110. In detail, a metal layer is formed on the substrate 110, and the gate electrode 120 is defined by patterning the metal layer using a photoresist etching process. Moreover, scan lines (not shown) of the thin film transistor substrate are also defined by patterning the metal layer using the photoresist etching process.

The substrate 110 is made of transparent material, such as glass, quartz, organic material, or polymer. The gate electrode 120 is made of elemental metal, an alloy, a metallic oxide, or a metallic nitride.

Figure 3:
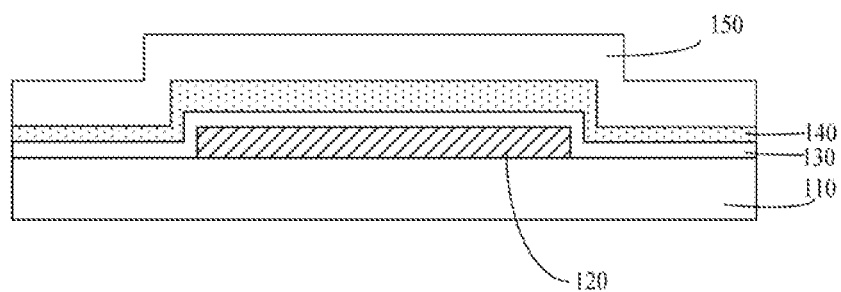
FIG. 3 illustrates that a gate insulating layer, a semiconductive layer, and a first photoresist layer are formed on the substrate.

At block 202, referring to FIG. 3, a gate insulating layer 130 is applied to cover the gate electrode 120, then a semiconductive layer 140 and a first photoresist layer 150 are successively formed on the substrate 110. The gate insulating layer 130 is made of inorganic material or organic material. The gate insulating layer 130 is deposited by a plasma chemical vapor deposition (PCVD) process. The semiconductive layer 140 is made of a semiconductive material, such as a metal oxide. In this embodiment, the first photoresist layer 150 is a positive photoresist layer. In other embodiments, the first photoresist layer 150 can be a negative photoresist layer.

At block 203, a first photoresist pattern 152 is formed by patterning the first photoresist layer 150. The first photoresist pattern 152 corresponds to the gate electrode 120. At block 204, a channel 142 is formed by etching an uncovered portion of the semiconductive layer 140 by the first photoresist pattern 152. At block 205, two opposite sides of the channel 142 are revealed from the first photoresist pattern 152 by removing two opposite sides of the first photoresist pattern 152.

Figure 4:
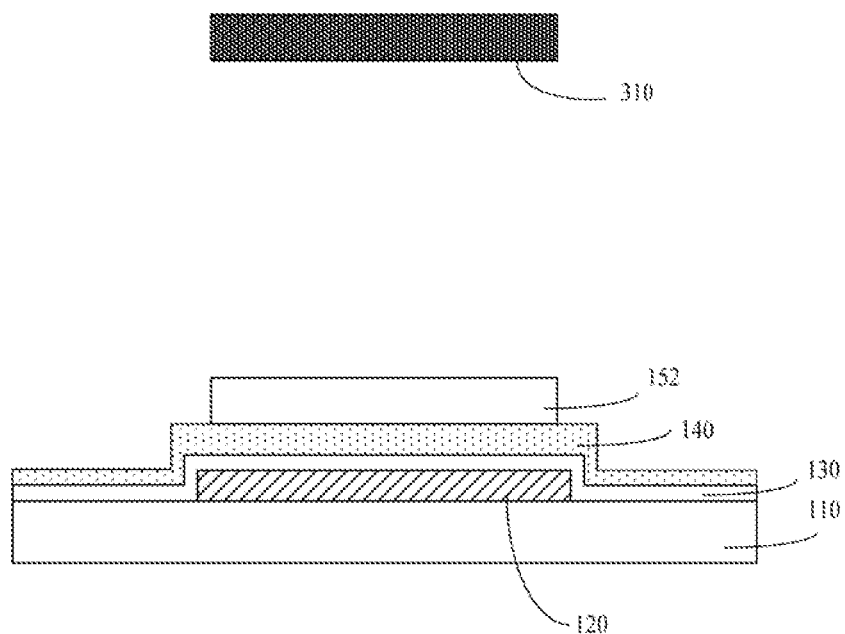
FIG. 4 illustrates a first method of fabricating a first photoresist pattern.
Figure 5:
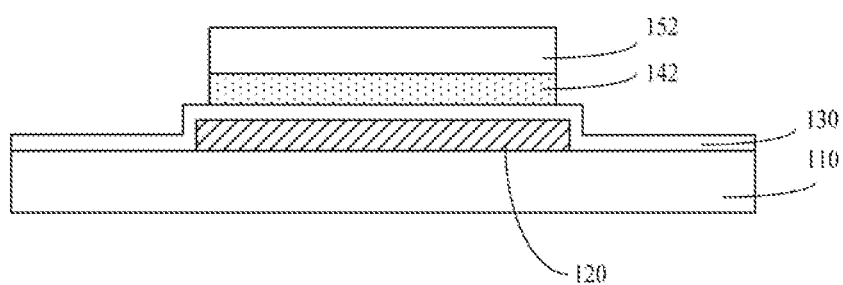
FIG. 5 illustrates the first method of fabricating a channel.
Figure 6:
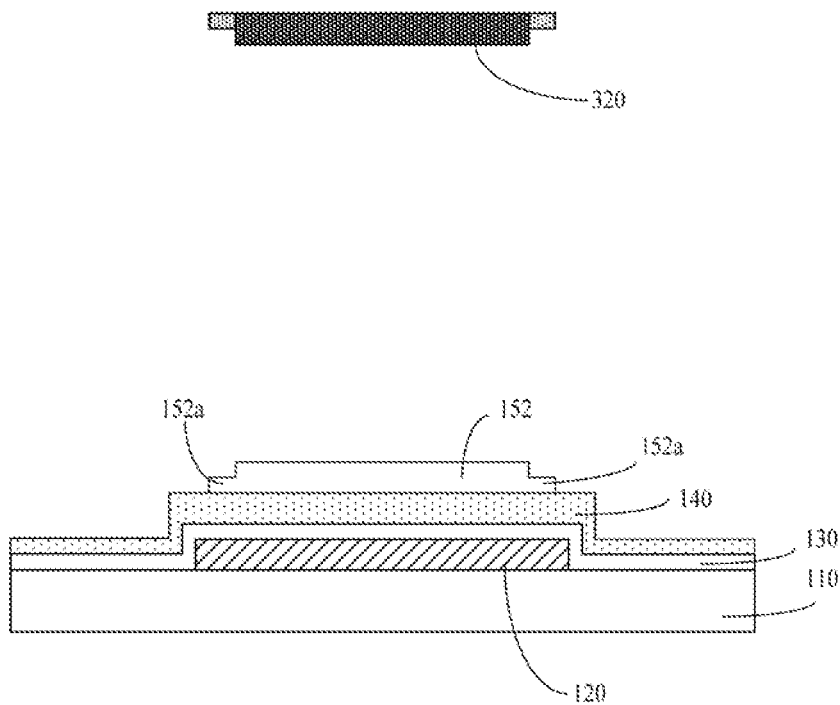
FIG. 6 illustrates a second method of fabricating the first photoresist patter.
Figure 7:
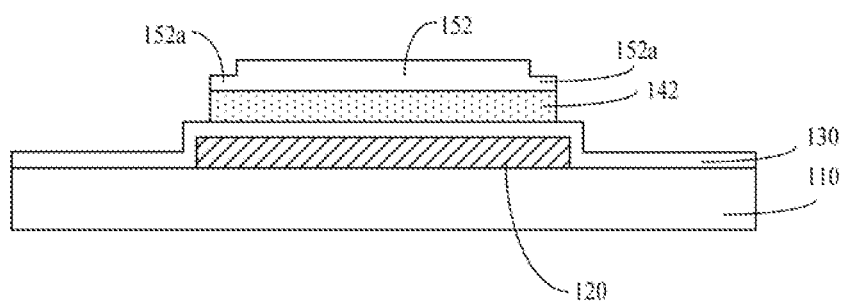
FIG. 7 illustrates the second method of fabricating the channel.
Figure 8:
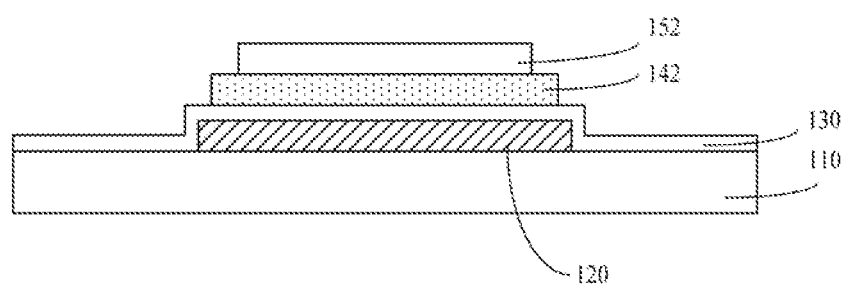
FIG. 8 illustrates that a thickness of the first photoresist pattern is reduced.

Two optional methods of fabricating the first photoresist pattern 152 and the channel 142 are disclosed as below. FIG. 4 illustrates a first method of fabricating the first photoresist pattern 152, and FIG. 5 illustrates the first method of fabricating the channel 142. FIG. 6 illustrates a second method of fabricating the first photoresist patter 152, and FIG. 7 illustrates the second method of fabricating the channel 142.

Referring to FIG. 4, in the first method, a shadow mask 310 is applied above a portion of the first photoresist layer 150 corresponding to the gate electrode 120 so as to form the first photoresist pattern 152, in an exposing and developing process. The shadow mask 310 is a mask with a uniform light transmittance, and after the exposing process, the first photoresist pattern 152 has a same thickness and has a same width as the channel 142.

Referring to FIG. 5, the channel 142 is formed by etching an uncovered portion of the semiconductive layer 140 by the first photoresist pattern 152. Then, referring to FIG. 8, an oxygen plasma ashing process is applied to the first photoresist pattern 152 to reduce a thickness and a width of the first photoresist pattern 152. Therefore, after the oxygen plasma ashing process, two opposite sides of the first photoresist pattern 152 are removed and two opposite sides of the channel 142 are revealed. That is, the width of the first photoresist pattern 152 is less than that of the channel 142.

In the second method, referring to FIG. 6, a half-tone mask 320 is applied above a portion of the first photoresist layer 150 corresponding to the gate electrode 120 so as to form the first photoresist pattern 152, in an exposing and developing process. The half-tone mask 320 has a low light transmittance in the middle and a high light transmittance in both sides. Thus, after the exposing process, a stepped structure 152a is formed at each opposite side of the first photoresist pattern 152.

Referring to FIG. 7, the channel 142 is formed by etching an uncovered portion of the semiconductive layer 140 by the first photoresist pattern 152, such that a width of the channel 142 is the same as a whole width of the first photoresist pattern 152. Then, referring to FIG. 8, an oxygen plasma ashing process is applied to the first photoresist pattern 152 to reduce a thickness of the first photoresist pattern 152. The two stepped structures 152a of first photoresist pattern 152 have a thickness less than the middle of the first photoresist pattern 152, and thus the middle of the first photoresist pattern 152 remains in existence while the two stepped structures 152a of first photoresist pattern 152 are removed. That is, the width of the first photoresist pattern 152 is less than that of the channel 142, and the two opposite sides of the channel 142 are exposed.

Figure 9:
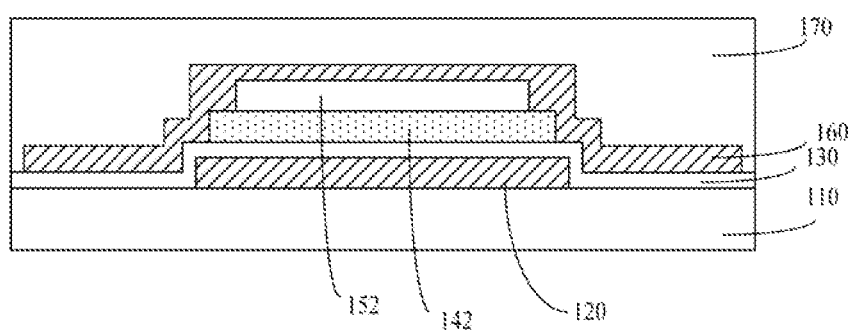
FIG. 9 illustrates that a metal layer and a second photoresist layer are formed on the whole surface of the substrate.

At block 206, referring to FIG. 9, a metal layer 160 is further formed to cover the whole surface of the substrate 110 which is made up of the gate insulating layer 130, the channel 142, and the first photoresist pattern 152. The metal layer 160 can be made of elemental metal, an alloy, a metallic oxide, or a metallic nitride. Then a second photoresist layer 170 is disposed on the metal layer 160. In the embodiment, the second photoresist layer 170 is a positive photoresist layer. In other embodiments, the second photoresist layer 170 can be a negative photoresist layer.

Figure 10:
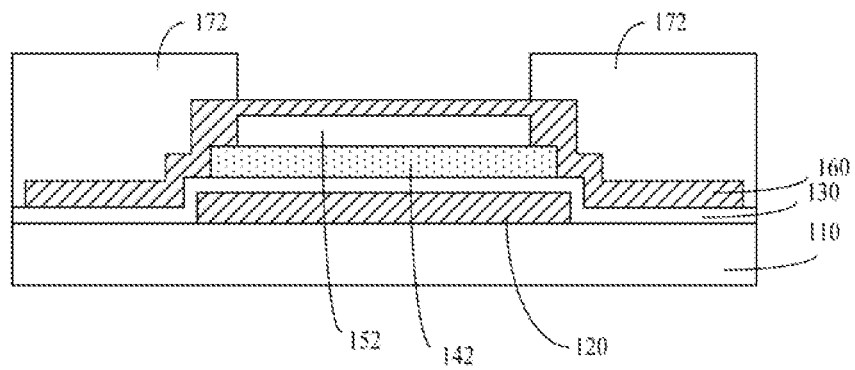
FIG. 10 illustrates that a second photoresist pattern is formed.

At block 207, referring to FIG. 10, the second photoresist layer 170 (not shown) is patterned to form a second photoresist pattern 172, such that the second photoresist pattern 172 covers the portions of the metal layer 160 which do not correspond to the first photoresist pattern 152. The second photoresist pattern 172 includes two opposite subparts and the two subparts defines a gap therebetween which is substantially equal to the width of the first photoresist pattern 152. The gap can also be not greater than the width of the first photoresist pattern 152. In the embodiment, the second photoresist pattern 172 can be formed by a lithography process.

Figure 11:
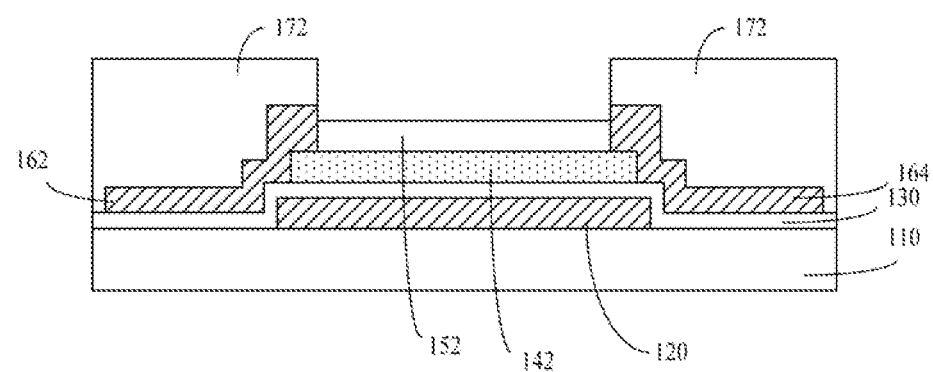
FIG. 11 illustrates that a source electrode and a drain electrode are formed.

At block 208, referring to FIG. 11, using the second photo pattern 172 as a mask, the metal layer 160 is etched to form a source electrode 162 and a drain electrode 164. At the same time, the first photoresist pattern 152 covers the channel 142 and functions as an etching stop layer for protecting the channel 142. Thus, an additional etching stop layer is not required. Moreover, data lines of the thin film transistor substrate 100 are also defined by patterning the metal layer 160.

Figure 12:
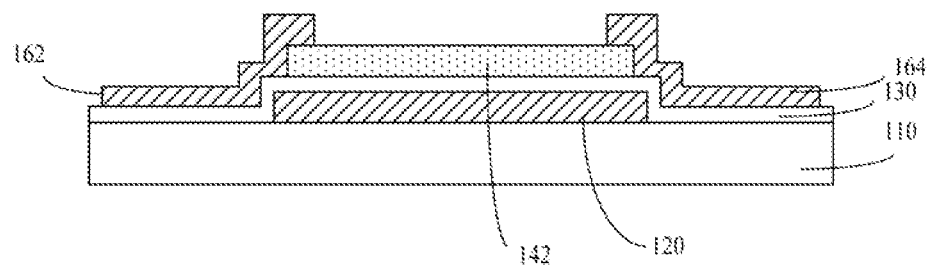
FIG. 12 illustrates that the first photoresist pattern and the second photoresist pattern are removed.

At block 209, referring to FIG. 12, the first photoresist pattern 152 and the second photoresist pattern 172 are removed.

Figure 13:
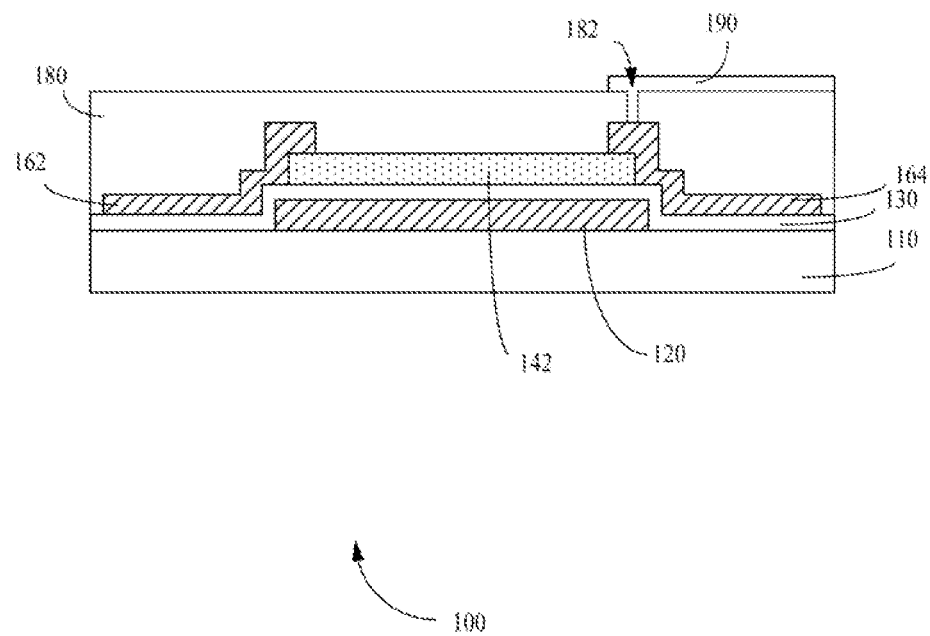
FIG. 13 illustrates that the thin film transistor substrate is obtained.

At block 210, referring to FIG. 13, a passivation layer 180 is further formed on the gate insulating layer 130, the source electrode 162, the channel 142, and the drain electrode 164. A connection hole 182 is defined in the passivation layer 180 corresponding to the drain electrode 164, and an electrode layer 190 is formed on the passivation layer 180 and is coupled with the drain electrode 164 via the connection hole 182.

The passivation layer 180 is made of inorganic material or organic material, and serves as an insulating layer. The position of the connection hole 182 is defined by patterning the passivation layer 180 using a photoresist etching process. The electrode layer 190 is made of a transparent conducting material, such as indium tin oxide (ITO) or indium zinc oxide (IZO). The present thin film transistor substrate 100 is thus obtained.

Figure 14:
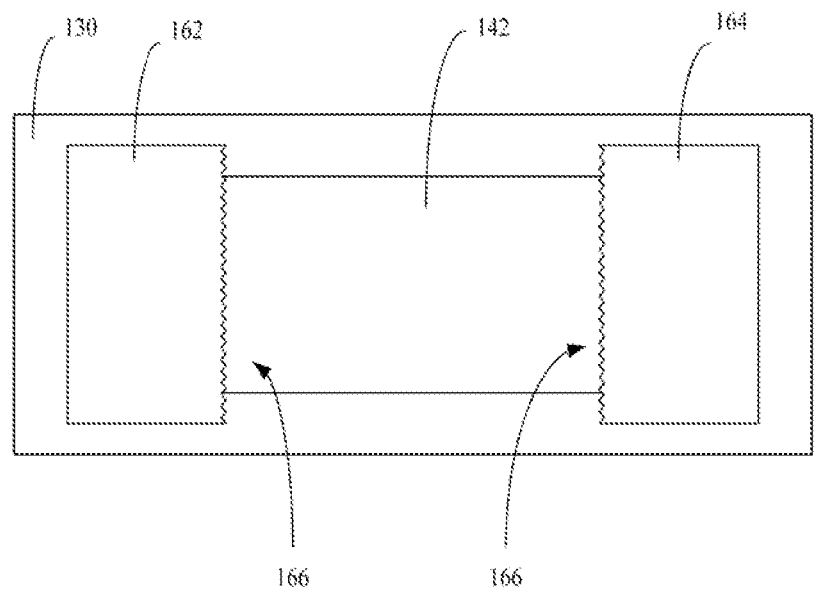
FIG. 14 is a diagrammatic view of the thin film transistor substrate.

Referring to FIG. 14, after the thin film transistor substrate 100 is obtained, one side of the source electrode 162 opposite to the drain electrode 164 and one side of the drain electrode 164 opposite to the source electrode 162 includes uneven contour line 166. In the embodiment, the uneven contour line 166 is shaped like the teeth of a saw.

The embodiments shown and described above are only examples. Many details are often found in the art such as the other features of a thin film transistor manufacture and method. Therefore, many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method of manufacturing a thin film transistor, the thin film transistor comprising a gate electrode, a source electrode, a channel, and a drain electrode, the method comprising:
  providing a substrate and forming a gate electrode on the substrate;
  forming a gate insulating layer to cover the gate electrode;
  forming a semiconductive layer and a first photoresist layer on the gate insulating layer;
  forming a first photoresist pattern by patterning the first photoresist layer;
  forming a channel by etching a portion of the semiconductive layer without covering by the first photoresist pattern;
  revealing two opposite sides of the channel from the first photoresist pattern by removing two opposite sides of the first photoresist pattern;
  forming a metal layer to cover the whole surface of the substrate which has formed with the gate insulating layer, the channel, and the first photoresist pattern;
  disposing a second photoresist layer on the metal layer;
  forming a second photoresist pattern by patterning the second photoresist layer;

forming a source electrode and a drain electrode by etching a portion of the metal layer without covering by the second photoresist pattern; and removing the first photoresist pattern and the second photoresist pattern, wherein the second photoresist pattern covers portions of the metal layer except a portion corresponding to the first photoresist pattern.

2. The method of claim 1, further comprising:

forming a passivation layer on the gate insulating layer, the source electrode, the channel, and the drain electrode after the first photoresist pattern and the second photoresist pattern are removed.

3. The method of claim 2, further comprising:

defining a connection hole in the passivation layer corresponding to the drain electrode after the passivation layer is formed.

4. The method of claim 3, further comprising:

forming an electrode layer on the passivation layer after the connection hole is defined, the transparent electrode layer is coupled with the drain electrode via the connection hole.

5. The method of claim 1, wherein the first photoresist pattern is corresponding to the gate electrode.

6. The method of claim 1, wherein the two opposite sides of the first photoresist pattern is removed by an oxygen plasma ashing process.

7. The method of claim 1, wherein a shadow mask is applied above a portion of the first photoresist layer corresponding to the gate electrode so as to form the first photoresist pattern in an exposing and developing process, the shadow mask is a mask with a uniform light transmittance, and after exposing process, the first photoresist pattern has a same thickness and has a same width with the channel.

8. The method of claim 7, wherein the first photoresist pattern is ashed by an oxygen plasma ashing process to reduce a thickness and a width of the first photoresist pattern.

9. The method of claim 8, wherein two opposite sides of the first photoresist pattern are removed and two opposite sides of the channel are revealed after the oxygen plasma ashing process, and the width of the first photoresist pattern is less than that of the channel.

10. The method of claim 1, wherein a half-tone mask is applied above a portion of the first photoresist layer corresponding to the gate electrode so as to form the first photoresist pattern in an exposing and developing process, the half-tone mask has a low light transmittance in the middle and a high light transmittance on both sides, and after the exposing process, two step structures are formed at two opposite sides of the first photoresist pattern respectively.

11. The method of claim 10, wherein the first photoresist pattern is ashed by an oxygen plasma ashing process to reduce a thickness of the first photoresist pattern.

12. The method of claim 11, wherein the middle of the first photoresist pattern is alive while the two step structures of first photoresist pattern are removed, and the width of the first photoresist pattern is less than that of the channel, and two opposite sides of the channel are exposed.

13. The method of claim 1, wherein the first photoresist layer and the second photoresist layer are positive photoresist layers.

14. The method of claim 1, wherein one side of the source electrode opposite to the drain electrode and one side of the drain electrode opposite to the source electrode comprises uneven contour line.

15. The method of claim 14, wherein the uneven contour line is shaped like teeth of a saw.

* * * * *